United States Patent [19]

Inoue et al.

[11] Patent Number: 5,750,403
[45] Date of Patent: May 12, 1998

[54] METHOD OF FORMING MULTI-LAYER WIRING UTILIZING HYDROGEN SILSESQUIOXANE RESIN

[75] Inventors: Yushi Inoue; Takahisa Yamaha, both of Hamamatsu, Japan

[73] Assignee: Yamaha Corporation, Japan

[21] Appl. No.: 678,568

[22] Filed: Jul. 12, 1996

[30] Foreign Application Priority Data

Jul. 14, 1995 [JP] Japan .................... 7-201590

[51] Int. Cl.$^6$ ........................ B05D 3/02
[52] U.S. Cl. ............... 438/787; 427/569; 427/120; 427/255.1; 427/376.2; 427/377; 427/419.2; 205/640; 204/192.22
[58] Field of Search ................ 427/569, 120, 427/255.1, 419.2, 376.2, 377; 204/192.22; 437/235, 243; 438/787; 205/640

[56] References Cited

U.S. PATENT DOCUMENTS

| | | | |
|---|---|---|---|
| 4,756,977 | 7/1988 | Haluska et al. | 428/704 |
| 5,059,448 | 10/1991 | Chandra et al. | 427/53.1 |
| 5,085,893 | 2/1992 | Weiss et al. | 427/387 |
| 5,118,530 | 6/1992 | Hanneman et al. | 427/226 |
| 5,145,723 | 9/1992 | Ballance et al. | 427/397.7 |
| 5,336,532 | 8/1994 | Haluska et al. | 427/515 |
| 5,370,904 | 12/1994 | Mine et al. | 427/126.2 |
| 5,380,567 | 1/1995 | Haluska | 427/578 |
| 5,399,441 | 3/1995 | Bearinger et al. | 428/689 |
| 5,458,912 | 10/1995 | Camilletti et al. | 427/126.4 |
| 5,481,135 | 1/1996 | Chandra et al. | 257/701 |

FOREIGN PATENT DOCUMENTS

| | | | |
|---|---|---|---|
| 6-181203 | 6/1994 | Japan | H01L 21/316 |
| 6-181204 | 6/1994 | Japan | H01L 21/316 |
| 6181203 | 6/1994 | Japan | H01L 21/316 |
| 6181204 | 6/1994 | Japan | H01L 21/316 |

OTHER PUBLICATIONS

B.T. Ahlburn, et al., "A Non–Etch Back Spin on Glass for 0.5µM Devices Using Hydrogen Silsesquioxane as a Replacement for Methylsiloxane", Jun. 7–8, 1994 VMIC Conference, pp. 120–122.

B.T. Ahlburn, et al., "Hydrogen Silsesquioxane–Based Flowable Oxide as an Element in the Interlevel Dielectric for Sub 0.5 Micron ULSI Circuits", Feb. 21–22, 1995 DUMIC Conference, pp. 36–42.

D.S. Ballance, et al., "Low Temperature Reflow Planarization Using a Novel Spin–On Interlevel Dielectric", Jun. 9–10, 1992 VMIC Conference, pp. 180–186.

D. Pramanik, et al., "Reliability of Multilevel Circuits Using Hydrogen Silsesquioxane $FO_x$ for Interlevel Dielectric Planarization", Jun. 8–9, 1993 VMIC Conference, pp. 329–331.

R. Dawson, et al., "Performance of Logic Devices Utilizing A Novel Spin–On Dielectric Planarization Process", Jun. 8–9, 1993 VMIC Conference, p. 218.

*Primary Examiner*—Benjamin Utech
*Attorney, Agent, or Firm*—Ostrolenk, Faber, Gerb & Soffen, LLP

[57] ABSTRACT

On a first insulating film covering a substrate, wiring layer patterns are formed and thereafter, a second insulating film of plasma CVD—$SiO_2$ or the like is formed thereon. A hydrogen silsesquioxane resin film having a flat surface is spin-coated on the second insulating film. Thereafter, the resin film is subjected to a first heat treatment in an inert gas atmosphere to convert the resin film into a silicon oxide film of a preceramic phase. On this silicon oxide film, a third insulating film of plasma CVD—$SiO_2$ or the like is formed. Thereafter, a second heat treatment is performed to convert the silicon oxide film of preceramic phase into a silicon oxide film of a ceramic phase, while preventing fine size projections from being formed on the surface of the silicon oxide film. Thereafter, a second wiring layer is formed on the third insulating film. It is possible to planarize an interlevel insulating film and improve a process yield.

22 Claims, 6 Drawing Sheets

METHOD OF FORMING MULTI-LAYER WIRING UTILIZING HYDROGEN SILSESQUIOXANE RESIN

BACKGROUND OF THE INVENTION

1. Field of the Invention

The invention relates to a method of forming a multi-layer wiring suitable for manufacture of LSIs or the like, and more particularly to a method of forming a multi-layer wiring whose interlevel insulating layer is made of hydrogen silsesquioxane resin or comparable SOG (spin-on-glass).

2. Description of the Related Art

It is known that an interlevel insulating layer of a multi-layer wiring structure can be formed by using hydrogen silsesquioxane resin (e.g., Japanese Patent Laid-open Publication No. 6-181204).

In forming such an interlevel insulating layer, a hydrogen silsesquioxane resin film is coated on the surface of a semiconductor device by spin coating or the like, the resin film is then subjected to a heat treatment in an inert gas atmosphere of $N_2$ or the like to convert the resin film into a silicon oxide film of preceramic phase, and the preceramic silicon oxide film is subjected to another heat treatment in an oxidizing atmosphere of $O_2$ or the like to convert the preceramic silicon oxide film into a silicon oxide film of a ceramic phase. The preceramic silicon oxide film is a precursor of silicon oxide of a ceramic phase, and is premature in its bridging or crosslinking (lower degree of polymerization) and insoluble to organic solvent.

With the above method, a silicon oxide film without cracks having a thickness of even 1 μm or larger can be formed. Such a silicon oxide film is useful for an interlevel insulating layer.

SUMMARY OF THE INVENTION

It is an object of the present invention to provide a novel method of forming a multi-layer wiring capable of improving a wiring manufacture yield.

According to one aspect of the present invention, there is provided a wiring forming method comprising the steps of: forming a first wiring layer on a first insulating film covering the surface of a substrate; forming a hydrogen silsesquioxane resin film having a flat surface over the first insulating film and the first wiring layer; subjecting the hydrogen silsesquioxane resin film to a first heat treatment in an inert gas atmosphere to convert the resin film into a silicon oxide film of a preceramic phase; forming a second insulating film on the silicon oxide film; subjecting the silicon oxide film covered with the second insulating film to a second heat treatment in an oxidizing atmosphere to convert the preceramic silicon oxide film into a silicon oxide film of a ceramic phase; and forming a second wiring layer on the second insulating film after the silicon oxide film of a ceramic phase is formed.

The silicon oxide film of a preceramic phase is covered with the second insulating film before the silicon oxide film of a ceramic phase is formed. There is therefore no room for fine size projections to generate and grow.

The shape of a via hole formed in the interlevel insulating film can be prevented from being deformed and the interlevel insulating film can be planarized. The wiring manufacture yield can therefore be improved.

DETAILED DESCRIPTION OF THE PREFERRED EMBODIMENTS

The present inventors have studied a known method of forming an interlevel insulating layer by using hydrogen silsesquioxane and have found that fine size projections of about 0.1 μm diameter are formed on the surface of a silicon oxide film of a ceramic phase. Generation of such fine size projections lowers a yield of wiring processes. The preliminary experiments made by the present inventors will be described below.

Hydrogen silsesquioxane resin can be spin-coated on a substrate after it is dissolved in solvent of methyl isobutyl ketone (MIBK). Therefore, from the viewpoint of processes, this resin is the same as conventional SOG (spin-on-glass), mostly organic siloxisane SOG. Hydrogen silsesquioxane resin has a chemical formula of $(HSiO_{3/2})n$ and is chemically inorganic SOG.

When hydrogen silsesquioxane resin is heated and reflowed, its planarization is superior to conventional SOG, and even if a resin film is formed thick, its high planarization can be retained. As products, "Flowable Oxide" (trade name) manufactured by Dow Corning Co. is known.

FIGS. 2A to 2E illustrate a multi-layer wiring forming method used by preliminary experiments.

Figure 2A:
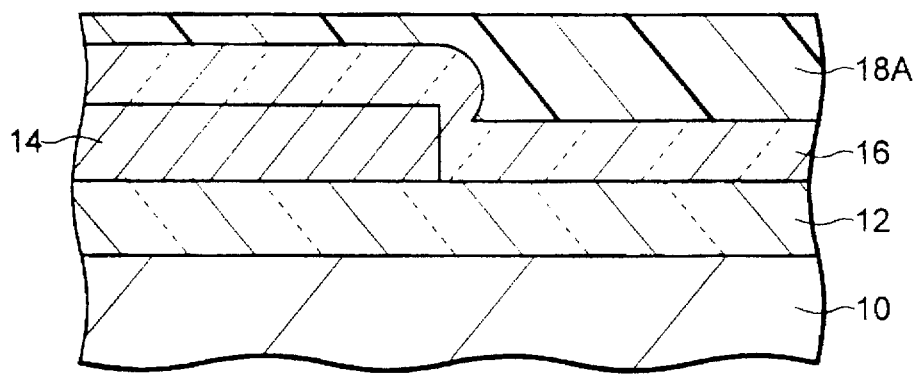
FIGS. 2A, 2B, 2C, 2D, and 2E are cross sectional views of a substrate illustrating the main processes of preliminary experiments made by the present inventors by using a conventional multi-layer wiring forming method.

Referring to FIG. 2A, an insulating film 12 of silicon oxide or the like is formed on the surface of a semiconductor substrate 10. A wiring layer 14 is formed on the insulating film 12. An insulating film 16 of silicon oxide is formed by plasma CVD (chemical vapor deposition), covering the insulating film 12 and wiring layer 14. Solution of hydrogen silsesquioxane resin dissolved in methyl isobutyl ketone (MIBK) is spin-coated over the substrate to form a hydrogen silsesquioxane resin film 18A with a flat surface on the insulating film 16.

Figure 2B:
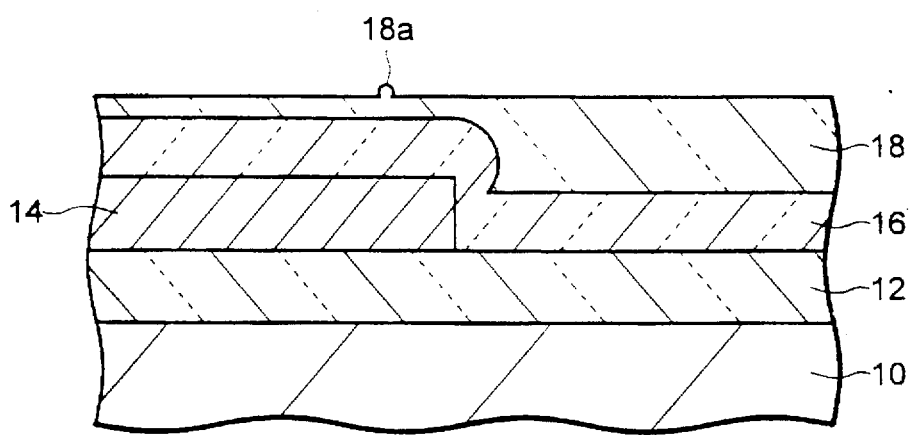

Referring to FIG. 2B, the resin film 18A is heat treated in an inert gas atmosphere to convert it into a silicon oxide film 18 of a preceramic phase. Heat treatment is further successively performed in a mixed gas atmosphere of $O_2$ and inert gas to convert the preceramic silicon oxide film 18 into a silicon oxide film of a ceramic phase.

At this time, a fine size projection 18a of about 0.1 μm diameter may sometimes be formed on the surface of the silicon oxide film 18 of a ceramic phase.

Figure 2C:
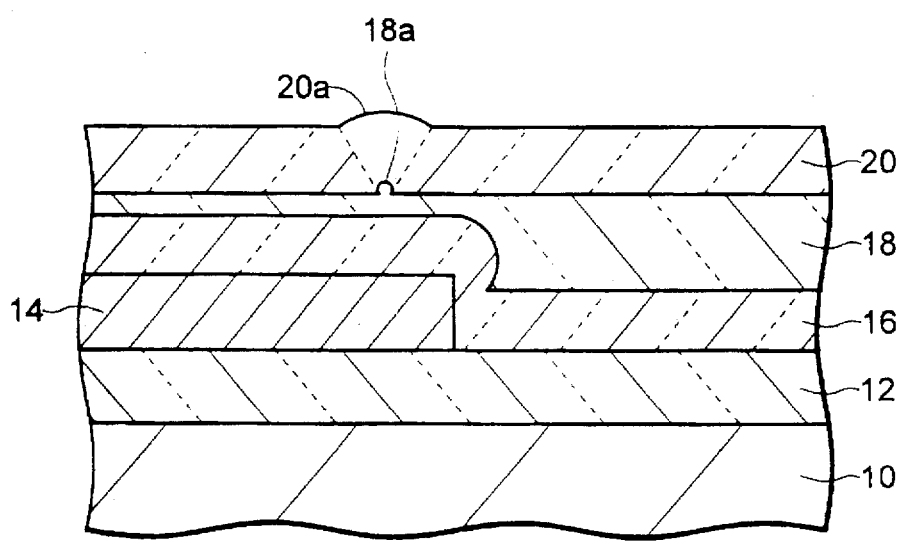

Referring to FIG. 2C, an insulating film 20 of silicon oxide is formed by plasma CVD, covering the ceramic silicon oxide film 18.

At this time, a convex 20a is formed on the surface of the insulating film 20 over the fine size projection 18a on the silicon oxide film, reflecting the fine size projection 18a with a high fidelity. As will be explained later, the quality of the insulating film 20 at the convex indicated by broken lines is degraded.

Figure 2D:
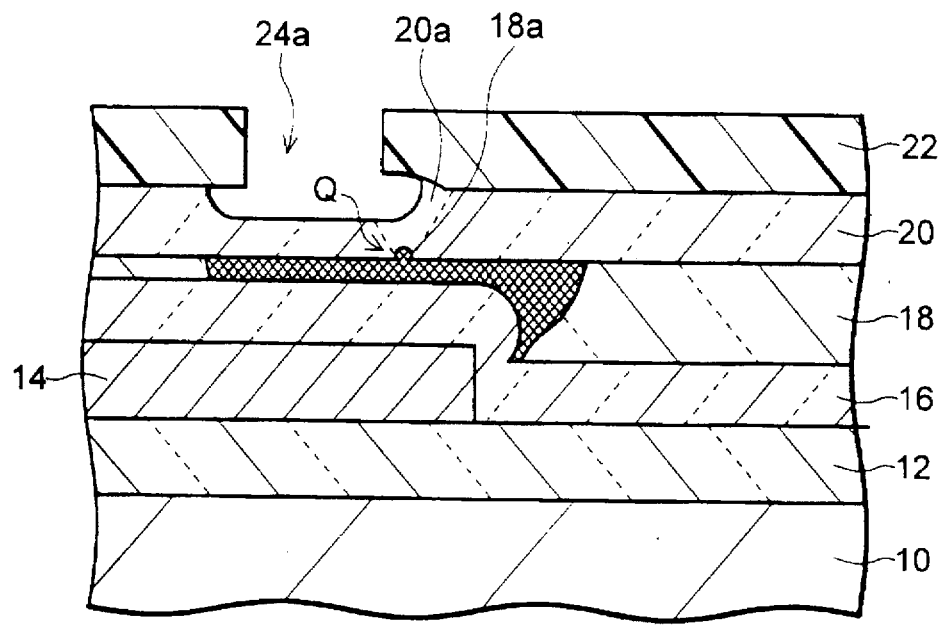

Referring to FIG. 2D, a resist layer 22 having an opening with a desired shape is formed on the insulating film 20. By selective wet etching (isotropic etching) using the resist layer 22 as a mask, a shallow via hole 24a is formed in the surface layer of the insulating film 20. This shallow via hole 24a expands the upper portion of a deep via hole to be later formed, to thereby alleviate steps and improve a wiring step coverage. In the wet etching process illustrated in FIG. 2D, etching liquid, for example, of NH$_4$F aqueous solution mixed with HF at a ratio of 10:1, is used.

Figure 2E:
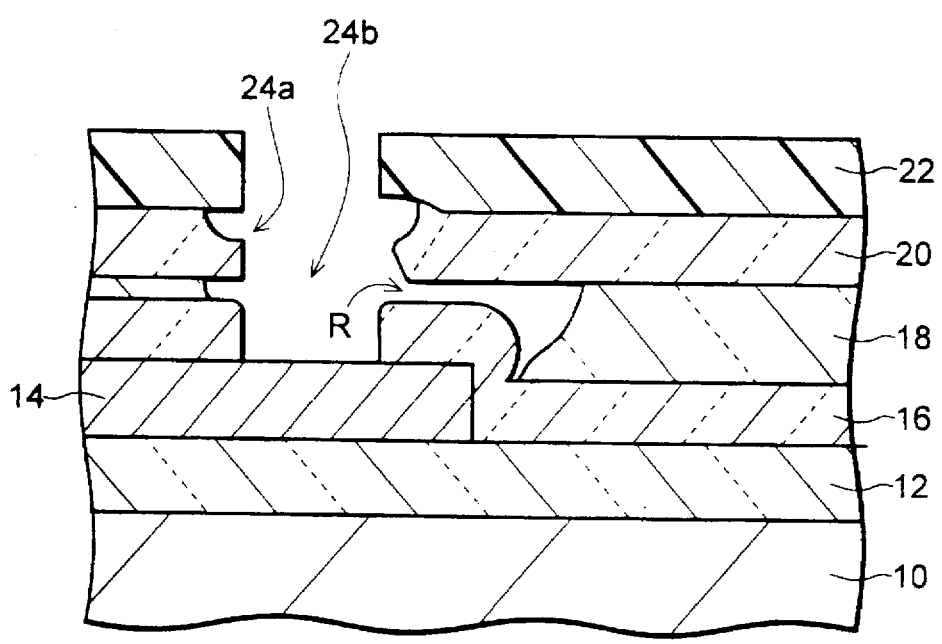

The film quality of the convex 20a is coarse and the wet etch rate is fast. The silicon oxide film 18 made of hydrogen silsesquioxane also has a fast wet etch rate. Therefore, if the convex 20a is exposed during etching, through this convex 20a, the fine size projection 18 and nearby region (cross hatched portion) Q are etched. Refer to FIGS. 2E for the final etched shape.

Referring to FIG. 2E, by selective dry etching (anisotropic etching) using the resist layer 22 as a mask, a via hole 24b continuous with the via hole 24a and reaching the wiring layer 14 is formed. Because of the excessive etching of the fine size projection and nearby region Q, the side wall of the via hole 24b is formed with a concave (or hollow) R.

As above, generation of the fine size projection 18a and the convex 20a deforms the shape of a via hole.

After the resist layer 22 is removed, wiring material is deposited over the substrate and patterned to form a wiring layer (not shown) reaching the wiring layer 14 through the via hole 24a and 24b. This wiring layer formed has a poor step coverage at the area corresponding to the concave R in the via hole 24b, and the wiring reliability is lowered.

Figure 3A:
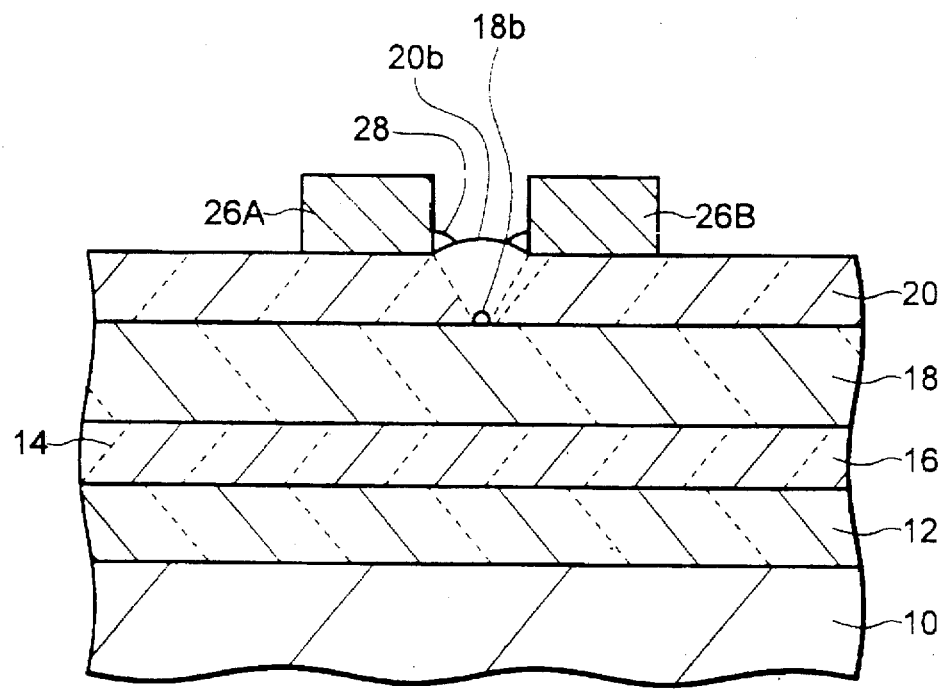
FIGS. 3A and 3B are a cross sectional view and a plan view showing the state of wiring layers formed near a convex area of an interlevel insulating film.
Figure 3B:
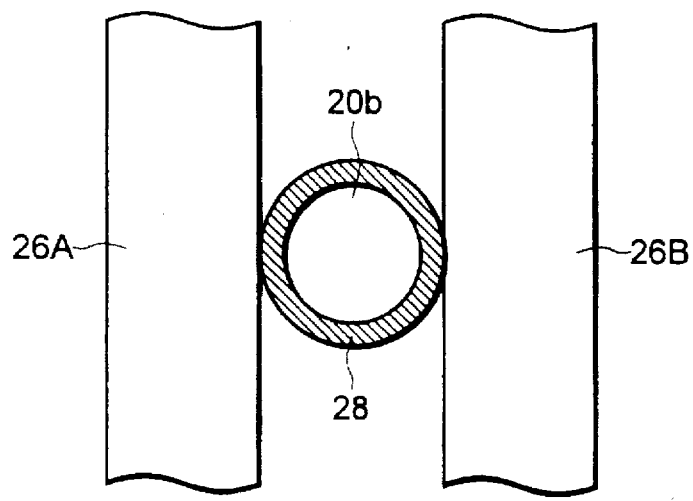

FIGS. 3A and 3B illustrate another issue brought about when the wiring layer is patterned. FIG. 3A is a cross sectional view of a substrate, and FIG. 3B is a plan view of the substrate. A fine size projection 18b and a convex 20b are formed in the same manner as the above-described fine size projection 18a and convex 20a.

After the process shown in FIG. 2C, a wiring material is deposited over the substrate and patterned by selective etching to form the wiring layer. In this case, if adjacent wiring layers 26A and 26B are formed facing each other near at the convex 20b, a portion of the wiring layer is left as an etching residue 28 around the convex 20b as shown in FIGS. 3A and 3B. This etching residue 28 electrically short-circuits the wiring layers 26A and 26B.

As above, a planarized insulating film using hydrogen silsesquioxane may form a fine size projection on the surface thereof. A CVD insulating film formed on this planarized insulating film with a fine size projection has a convex of poor film quality which leads to deformation of the shape of via holes and a short-circuit between wiring layers. In the following, an embodiment of the invention will be described.

This embodiment pertains to a method of manufacturing a semiconductor device wherein an insulating interlayer is formed using spin-on-glass made of hydrogen silsesquioxane resin (HSiO$_{3/2}$)n. After hydrogen silsesquioxane resin is coated, it is heated to convert it into an oxide film of a preceramic phase. A first insulating interlayer is formed on the preceramic oxide film by plasma CVD or the like, and thereafter the substrate is subjected to a further heat treatment in an oxidizing atmosphere to ceramify the preceramic hydrogen silsesquioxane resin solution into a second insulating interlayer of silicon oxide.

It is therefore possible to prevent fine size projections from being formed on the first insulating interlayer during the ceramifying heat treatment.

FIGS. 1A to 1F illustrate a method of forming a multilayer wiring according to an embodiment of the invention. Processes (1) to (6) corresponding to FIGS. 1A to 1F will be sequentially described.

Figure 1A:
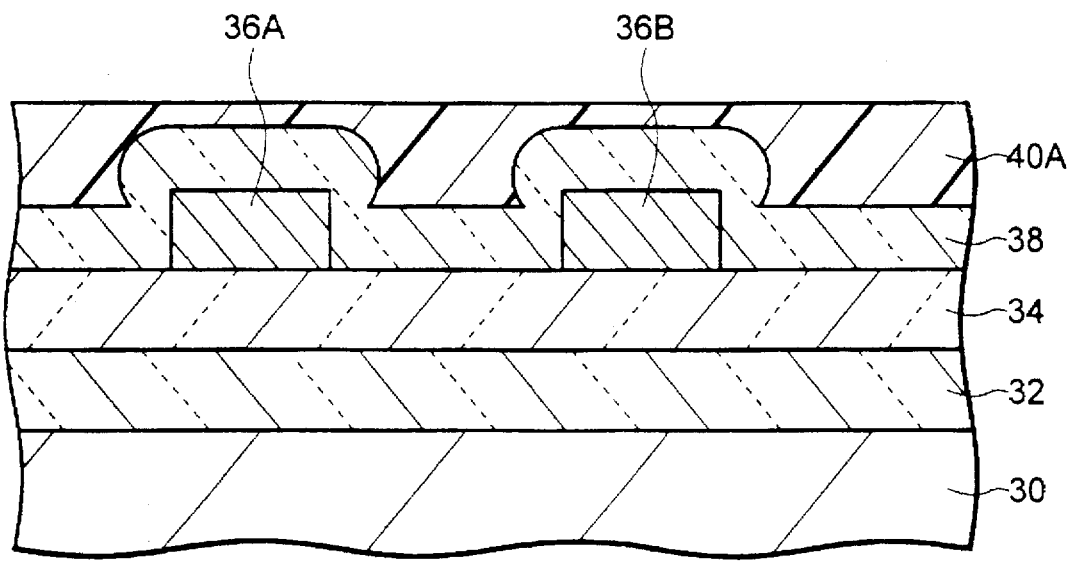
FIGS. 1A, 1B, 1C, 1D, 1E, and 1F are cross sectional views of a substrate illustrating the main processes of a method of forming a multi-layer wiring according to an embodiment of the invention.

(1) As shown in FIG. 1A, an insulating film 32 of silicon oxide or the like is formed on the surface of a semiconductor substrate 30 of silicon or the like. For example, the insulating film 32 is a field oxide film formed through local oxidation of silicon (LOCOS) and has apertures exposing active regions. Each active region is formed with a metal-oxide-semiconductor (MOS) transistor by known methods.

An insulating film 34 of borophosphosilicate glass (BPSG) is deposited to a thickness of 750 nm by atmospheric pressure CVD or the like. The insulating film 34 is subjected to lamp annealing to make the film quality dense.

Examples of the conditions of forming the insulating film 34 are as follows:

Substrate Temperature: 400° C.

Source Gas: SiH$_4$ (46.25 sccm)+PH$_3$ (8.75 sccm) + B$_2$H$_6$ (7.5 sccm)+O$_2$ (7000 sccm) + N$_2$ (50000 sccm)

Examples of the conditions of lamp annealing are as follows:

Substrate Temperature: 850° C.

Temperature Rise Time to 850° C. 10 seconds

Keeping Time at 850° C. 10 seconds

Next, a wiring material layer is formed over the substrate by sputtering or the like, and a resist pattern is formed on the wiring material layer. By using the resist pattern as a mask, the wiring material layer is selectively dry-etched and patterned to form wiring layers 36A and 36B. The resist pattern is removed thereafter. An example of the wiring material layer is a laminate of a Ti layer (20 nm), a TiON layer (100 nm), an Al—Si—Cu alloy layer (400 nm), and a TiN layer (40 nm) stacked in this order from the bottom. Examples of the conditions of dry etching are as follows:

Etching Gas: Cl$_2$ (30 sccm)+BCl$_3$ (30 sccm)

Etching Chamber Pressure: 10 mTorr

Next, an insulating film 38 of silicon oxide (SiO$_2$) is formed on the insulating film 34 to a thickness of 300 nm by CVD, covering the wiring layers 36A and 36B. Example of the conditions of forming the insulating film 38 are as follows:

Substrate Temperature: 400° C.

Source Gas: SiH$_4$ (240 sccm) +N$_2$O (5000 sccm) + N$_2$ (2800 sccm)

Reaction Chamber Pressure: 2.2 Torr Next, a hydrogen silsesquioxane resin film 40A having a planarized surface is formed over the insulating film 38. For example, the resin film 40A was formed by coating, with a spin coater, solution of hydrogen silsesquioxane resin dissolved in MIBK to a thickness of 500 nm. The thickness of the resin film 40A is optional in the range from 300 to 600 nm.

Figure 1B:
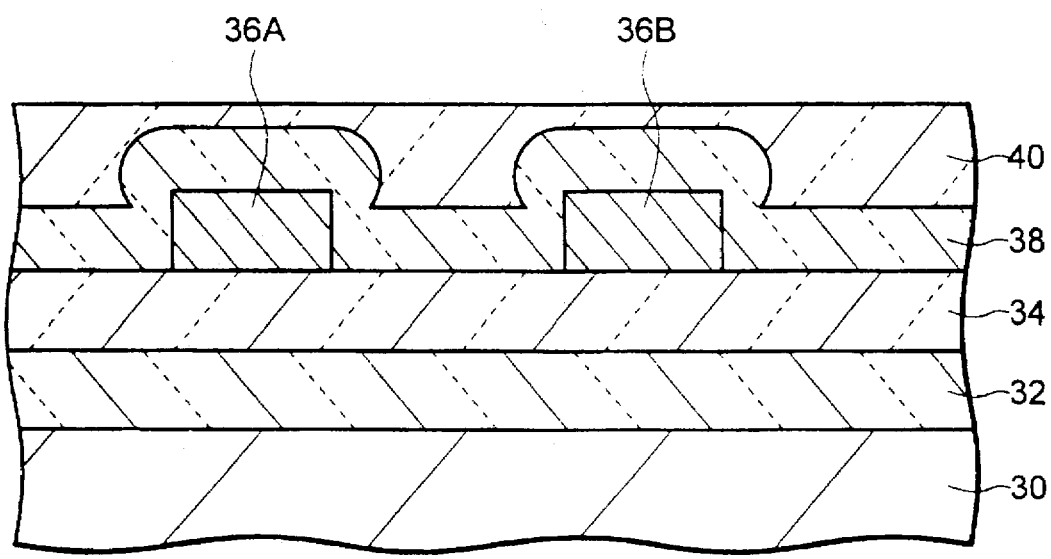

(2) As shown in FIG. 1B, the resin film is subjected to a heat treatment in an inert gas atmosphere to convert the resin film 40A into a preceramic silicon oxide film 40. In this heat treatment, for example, N$_2$ gas is used as the inert gas and heating continues for 1 to 60 minutes at a temperature in the range from 150° C. or higher, and lower than 350° C. In one example, the heat treatment was performed for one minute at 150° C. +one minute at 200° C.+one minute at 300° C., in an N$_2$ gas atmosphere using a hot plate.

The heating temperature is preferably 300° C. or lower in order to retain the fluidity of hydrogen silsesquioxane resin and reliably prevent fine size projections from being formed.

Figure 1C:
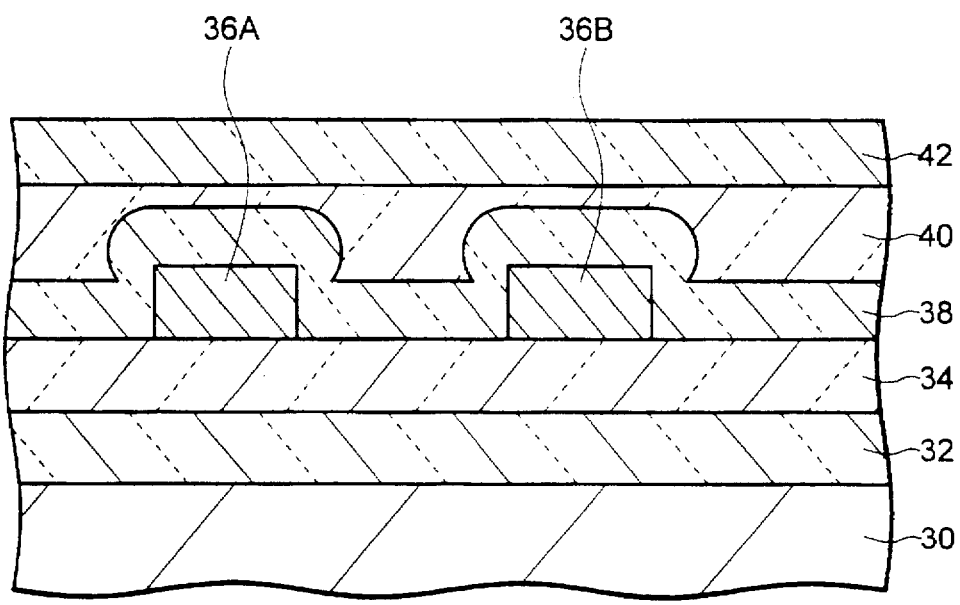

(3) As shown in FIG. 1C, an insulating film 42 of silicon oxide (SiO$_2$) is formed to a thickness of 500 nm by plasma CVD, covering the preceramic silicon oxide film 40. Examples of the conditions of forming the insulating film 42 are as follows:

Substrate Temperature: 400° C.

Source Gas: SiH$_4$ (240 sccm)+N$_2$O (5000 sccm)+ N$_2$ (2800 sccm)

Reaction Chamber Pressure: 2.2 Torr The insulating film 42 prevents fine size projections from being formed when the preceramic silicon oxide film 40 (now covered with the insulating film 42) is ceramified. The silicon oxide film 42 formed by plasma CVD may be replaced by another silicon oxide film formed by the following method (a) or (b).

(a) Plasma CVD using as source gases TEOS (Tetra Ethyl Ortho Silicate [Si(OC$_2$H$_5$)$_4$]) and O$_2$. Examples of the conditions of this film forming method are as follows:

Substrate Temperature: 400° C.

Source Gas: TEOS (1.8 cc/min [supplied in liquid]) +O$_2$ (8000 sccm)

Reaction Chamber Pressure: 2.2 Torr (b) Sputtering with a target of SiO$_2$. Examples of the conditions of this film forming method are as follows:

System Used: RF sputtering system (13.56 MHz)

Substrate Temperature: 200° C.

Target: SiO$_2$

Reaction Chamber Pressure: 6 mTorr

Atmosphere in Reaction Chamber: mixed gas of Ar and O$_2$

RF Power: 1 KW

After the insulating film 42 is formed, another heat treatment is performed so that the preceramic silicon oxide film 40 is converted into a ceramic silicon oxide film. Specifically, under the condition that the preceramic silicon oxide film 40 is covered with the insulating film 42, the heat treatment is performed for 5 to 120 minutes at 350 to 500° C. in an oxidizing atmosphere of oxygen gas (or mixed gas of oxygen gas and inert gas) or the like. In one example, the heat treatment was performed for 60 minutes at 400° C. in an atmosphere of mixed gas of O$_2$ and N$_2$.

With the thickness of the preceramic silicon oxide film 40 being set in a range from 300 to 600 nm, the ceramic silicon oxide film 40 underwent the above heat treatment did not form conventional fine size projections. The inventors consider this as resulting from no room for generation and growth of fine size projections because the surface of the preceramic silicon oxide film 40 is covered with the insulating film 42.

Figure 1D:
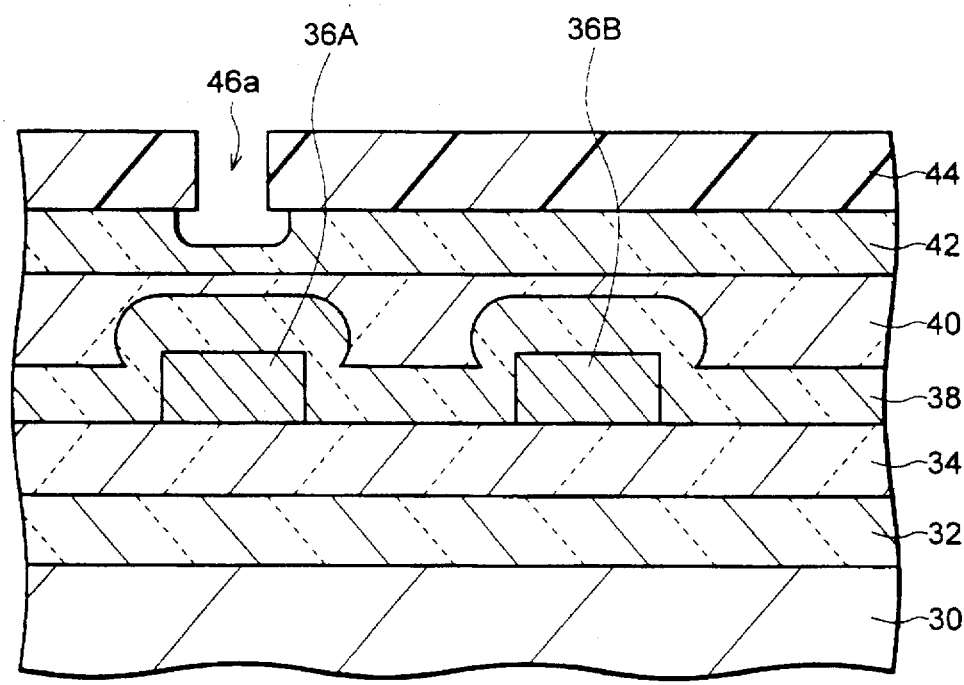

(4) As shown in FIG. 1D, after a resist film 44 having a desired aperture for forming a via hole is formed on the insulating film 42 by known photolithography, a shallow via hole 46a is selectively formed by wet etching (isotropic etching) by using the resist film 44 as a mask. The via hole 46a expands the upper diameter of a deep via hole 46b to be later formed, to thereby alleviate steps and improve a wiring step coverage.

In the wet etching process, etching liquid of NH$_4$F aqueous solution mixed with HF at a ratio of 10:1, was used. In the processes illustrated from FIGS. 1A to 1C, neither fine size projections were formed on the silicon oxide film 40, nor corresponding convexes were formed on the insulating film 42. Etchant did not permeate into the silicon oxide film 40 and no part of the film 40 was dissolved as opposed to conventional examples.

Figure 1E:
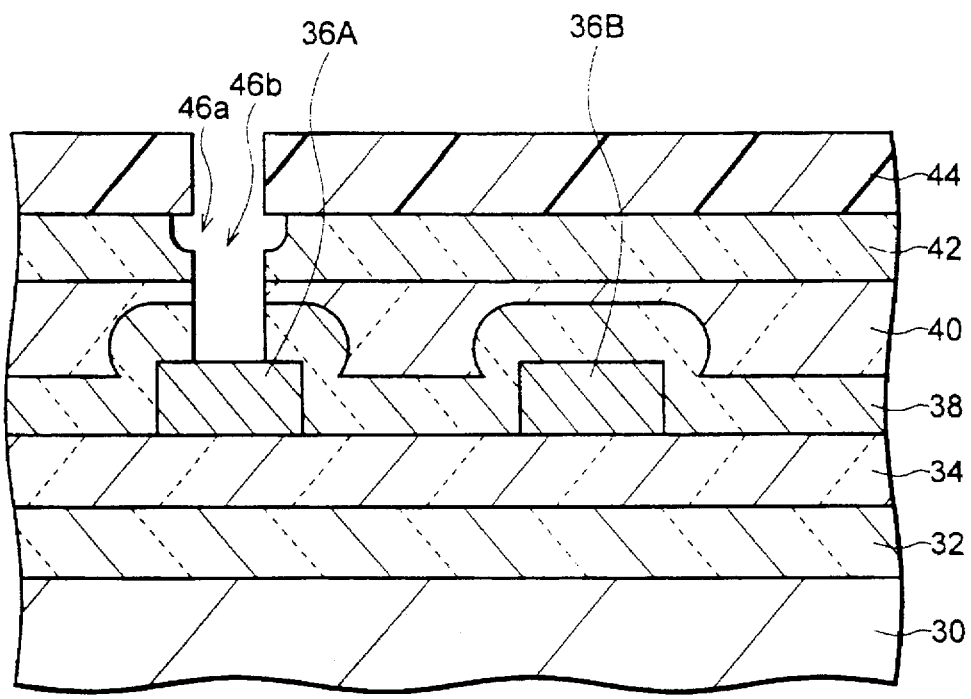

(5) As shown in FIG. 1E, by selective dry etching (anisotropic etching) using the resist layer 44 as a mask, a via hole 46b continuous with the via hole 46a and reaching the wiring layer 36A is formed. The resist film 44 is removed thereafter. Since there is no partial dissolution of the silicon oxide film 40, the inner wall of the via hole 46b has a normal shape without a concave such as the concave R shown in FIG. 2E.

Figure 1F:
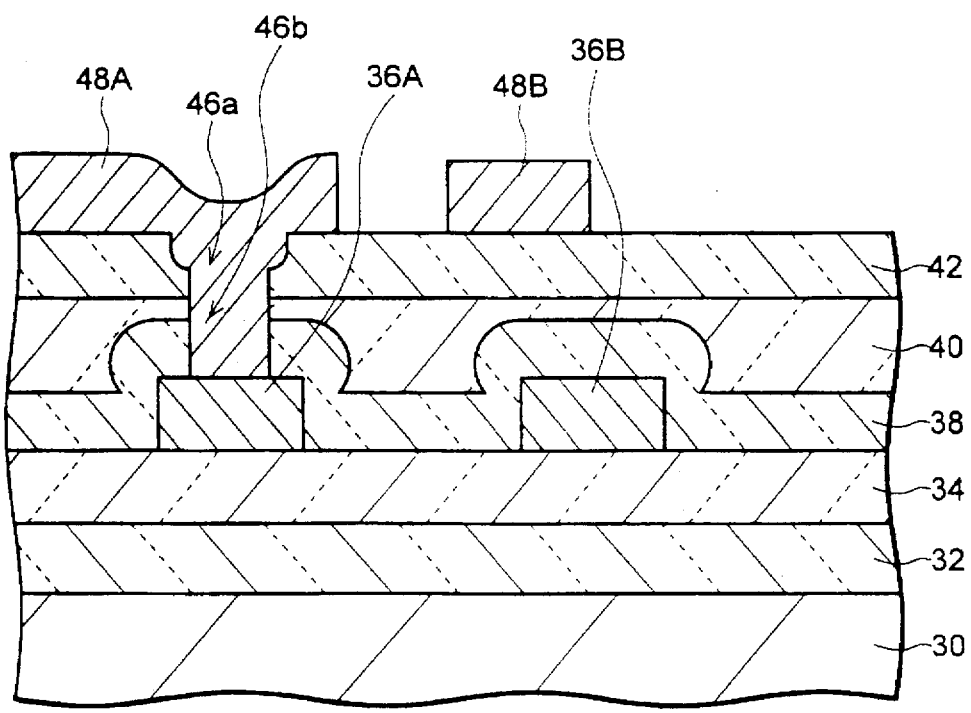

(6) As shown in FIG. 1F, a wiring material layer is formed over the substrate by sputtering or the like and a resist pattern is formed on the wiring material layer. By using this resist pattern as a mask, the wiring material layer is patterned by selective dry etching to form wiring layers 48A and 48B on the insulating film 42. The wiring layer 48A is connected via the via holes 46a to 46b to the wiring layer 36A. The wiring material layer was formed by sputtering Al—Si—Cu alloy to a thickness of 400 nm. Examples of the conditions of dry etching were as follows:

Etching Gas: Cl$_2$ (30 sccm)+BCl$_3$ (30 sccm)

Etching Chamber Pressure: 10 mTorr

Since the via holes 46a and 46b are formed in a normal shape, the wiring layer 48A can be formed with a good step coverage. Furthermore, since a convex reflecting the fine size projection such as shown in FIGS. 3A and 3B is not formed, the wiring layers 48A and 48B are not electrically short-circuited by an etching residue of the wiring material layer even if the wiring layers 48A and 48B are disposed near each other.

Stress may remain in the ceramic silicon oxide film 40 because fine size projections are suppressed from being formed. It can be considered, however, that any defect will not be made by this residual stress because the total volume of fine size projections to be generated when the preceramic silicon oxide film is not covered with the insulating film is very small as compared with the total volume of the preceramic silicon oxide film. Any defect was not actually found in embodiment devices.

The insulating film 38 also has a function of suppressing hillock generation of the wiring layers 36A and 36B. In some cases, the insulating film 38 may be omitted and the hydrogen silsesquioxane resin film 40A is formed to directly cover the insulating film 34 and wiring layers 36A and 36B.

Of the interlevel insulating films between the wiring layers 36A and 36B and the wiring layers 48A and 48B, the uppermost insulating film 42 is desired to satisfy the conditions that cracks are difficult to be formed, that hygroscopicity is low, and that it can be formed at a low temperature. An insulating film formed by the above-described two types of methods, plasma CVD and sputtering, satisfies the above conditions and is suitable for the insulating film 42. Although sputtering has a low step coverage property and cannot be used on a stepped surface, it can be used without any problem on the planarized surface of the hydrogen silsesquioxane resin film.

The insulating film 42 covering the silicon oxide film 40 in ceramifying the preceramic silicon oxide film 40 may be an insulating film formed by a method with a good step coverage such as atmospheric pressure CVD, such a film being a PSG (phosphosilicate glass) film, a BPSG (borophosphosilicate glass) film, or the like. In this case, after the preceramic silicon oxide film 40 is ceramified and before a wiring material layer is formed, an insulating film of silicon oxide or the like formed by plasma CVD or sputtering may be formed on the insulating film to form the wiring material layer on this insulating film.

The two wiring layers described above may be any pair of adjacent wiring layers of multi-layer wiring layers, or another wiring layer may be interposed between such a pair of adjacent wiring layers.

Instead of a hydrogen silsesquioxane resin film, an SOG film having a similar chemical nature may be used.

Although the present invention has been described in connection with the preferred embodiments, the invention is not limited only to the above embodiments. It is apparent to those skilled in the art that various modifications, improvements, combinations and the like can be made without departing from the scope of the appended claims.

We claim:

1. A wiring forming method comprising the steps of:

forming a first wiring layer on a first insulating film covering the surface of a substrate;

forming a hydrogen silsesquioxane resin film having a surface over said first insulating film and said first wiring layer;

subjecting said hydrogen silsesquioxane resin film to a first heat treatment in an inert gas atmosphere to convert said resin film into a silicon oxide film of a preceramic phase;

forming a second insulating film on said silicon oxide film;

subjecting said silicon oxide film covered with said second insulating film to a second heat treatment in an oxidizing atmosphere to convert said preceramic silicon oxide film into a silicon oxide film of a ceramic phase; and forming a second wiring layer on said second insulating film after said silicon oxide film of a ceramic phase is formed.

2. A wiring forming method according to claim 1, wherein said first heat treatment is performed in a temperature range of 150° C. or higher and lower than 350° C.

3. A wiring forming method according to claim 2, wherein said first heat treatment is performed at a temperature of 300° C. or lower.

4. A wiring forming method according to claim 2, wherein the inert gas atmosphere of said first heat treatment is nitrogen gas.

5. A wiring forming method according to claim 1, wherein said second heat treatment is performed in a temperature range from 350° C. to 500° C.

6. A wiring forming method according to claim 5, wherein said second heat treatment is performed for a period of 5 minutes to 120 minutes.

7. A wiring forming method according to claim 1, wherein has a thickness in a range from 300 nm to 600 nm after said first heat treatment.

8. A wiring forming method according to claim 7, wherein said step of forming said second insulating film comprises forming a silicon oxide film by one of plasma CVD using $SiH_4$ as a silicon source material, plasma CVD using tetra ethyl ortho silicate as a silicon source material, and sputtering using $SiO_2$ as a target.

9. A wiring forming method according to claim 7, wherein said step of forming said second insulating film comprises forming a silicon oxide film by atmospheric pressure CVD.

10. A wiring forming method according to claim 9, wherein the silicon oxide film formed by the atmospheric pressure CVD contains phosphorous or boron.

11. A wiring forming method according to claim 10, further comprising the step of forming a third insulating film after said second heat treatment and before said step of forming said second wiring layer.

12. A wiring forming method according to claim 11, wherein said step of forming said third insulating film comprises forming a silicon oxide film by plasma CVD or sputtering.

13. A wiring forming method according to claim 1, further comprising the step of forming a surface covering insulating film by CVD on said first wiring layer and on said first insulating film between said step of forming said first wiring layer and said step of forming said hydrogen silsesquioxane resin film.

14. A wiring forming method according to claim 13, wherein said step of forming said surface covering insulating film comprises forming a silicon oxide film by plasma CVD.

15. A wiring forming method according to claim 1, further comprising the step of forming a via hole in said second insulating film and said silicon oxide film of a ceramic phase between said second heat treatment and said step of forming said second wiring layer.

16. A wiring forming method according to claim 15, wherein said step of forming said via hole includes isotropic etching and anisotropic etching following the isotropic etching.

17. A wiring forming method according to claim 16, wherein said isotropic etching is performed within said second insulating film.

18. A wiring forming method according to claim 17, wherein the isotropic etching is wet etching.

19. A method of forming a wiring layer, comprising the steps of:

(a) providing a substrate having an overlying structure;

(b) forming a hydrogen silsesquioxane resin film of a preceramic phase over the substrate;

(c) forming an interlayer insulating film over the preceramic phase hydrogen silsesquioxane resin film; and (d) after the step (c), ceramifying the hydrogen silsesquioxane resin film by heating.

20. A method according to claim 19, wherein the overlying structure is a MOS transistor structure and a first insulating layer formed on the substrate.

21. A method according to claim 19, wherein the step (b) is performed in an inert atmosphere.

22. A method according to claim 19, wherein the step (d) is performed in an oxidizing atmosphere.

* * * * *